United States Patent

Nyswander

[15] 3,701,059

[45] Oct. 24, 1972

[54] REMOTE CONTROLLED, ADJUSTABLE BANDWIDTH LOW PASS FILTER

[72] Inventor: Reuben E. Nyswander, China Lake, Calif.

[73] Assignee: The United States of America as represented by the Secretary of the Navy

[22] Filed: April 16, 1971

[21] Appl. No.: 134,777

[52] U.S. Cl.................333/70 A, 333/70 CR, 330/35, 307/304, 307/295, 328/167

[51] Int. Cl............................H03h 7/10, H03h 11/00

[58] Field of Search..............333/70 R, 70 CR, 70 A; 307/304, 295; 330/35; 328/167

[56] References Cited

UNITED STATES PATENTS 3,604,947 9/1971 Puthuff..............333/70 CR X 3,588,531 6/1971 Bjor.....................333/70 A X 3,526,858 9/1970 Heinlein et al...........333/70 R

*Primary Examiner*—Eli Lieberman

*Assistant Examiner*—Marvin Nussbaum

*Attorney*—R. S. Sciascia, Roy Miller and Robert W. Adams

[57] ABSTRACT

A bandwidth controlled, low pass filter circuit having a resistor, capacitor, voltage follower amplifier, and an insulated gate, metallic oxide semiconductor, field effect transistor utilized as a switch, in which the transistor and the resistor, together, provide the effective circuit filter resistance, and the bandwidth is controlled by the transistor gate pulse frequency and pulse width. The use of several such filters as a filter bank is also disclosed.

4 Claims, 3 Drawing Figures

INVENTOR.
REUBEN E. NYSWANDER
BY : ROY MILLER
ROBERT W. ADAMS
ATTORNEYS.

REMOTE CONTROLLED, ADJUSTABLE BANDWIDTH LOW PASS FILTER

BACKGROUND OF THE INVENTION

The invention relates to the field of low pass filter circuits and, more specifically, to the bandwidth control thereof. In general, RC low pass filters are RC circuits in which the bandwidth is a function of the resistance (R) and the capacitance (C).

Prior devices for controlling the filter bandwidth consisted of a plurality of transistors, capacitors, diodes, and resistors. The circuit's bandwidth is chosen by selectively switching one of the plurality of capacitors into the filter circuit. The switching is accomplished by means of a transistor switch. For a filter bank having a plurality of filters, each filter includes the transistors, capacitors, diodes, and resistors mentioned above.

SUMMARY OF THE INVENTION

The present invention is a low pass filter, and a bank of such filters. Each filter has an insulated gate, metallic oxide semiconductor, field effect transistor (MOS-FET) connected in series with a resistor, which provide, in combination, the effective filter resistance. Also included is a capacitor, a voltage follower amplifier, and a control input coupled to the gate of the MOS-FET. The effective filter resistance and the capacitor function as an integrating network.

The filter of the present invention is simple, efficient, and easily controlled; and requires significantly fewer components than prior devices.

DESCRIPTION OF THE PREFERRED EMBODIMENT

Figure 1:
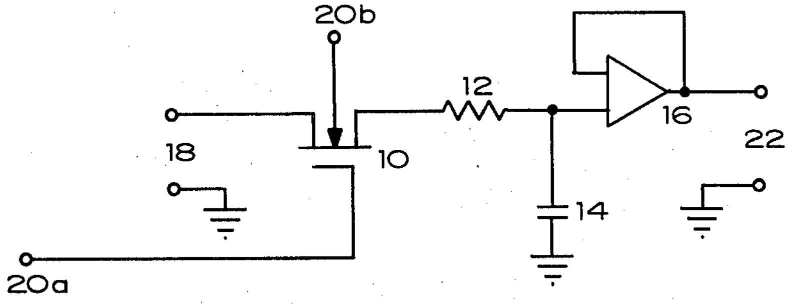
FIG. 1 is a schematic diagram of the present invention.

The present invention, shown in FIG. 1, includes an insulated gate MOS-FET 10, resistor 12, capacitor 14, and voltage follower amplifier 16. Input signal input 18 is coupled to the source end, and gate input 20*a* is coupled to the insulated gate electrode, of MOS-FET 10. The voltage follower amplifier output is the filter system output 22. The filter control signal is coupled to gate input 20*a*.

Figures 2, 3:
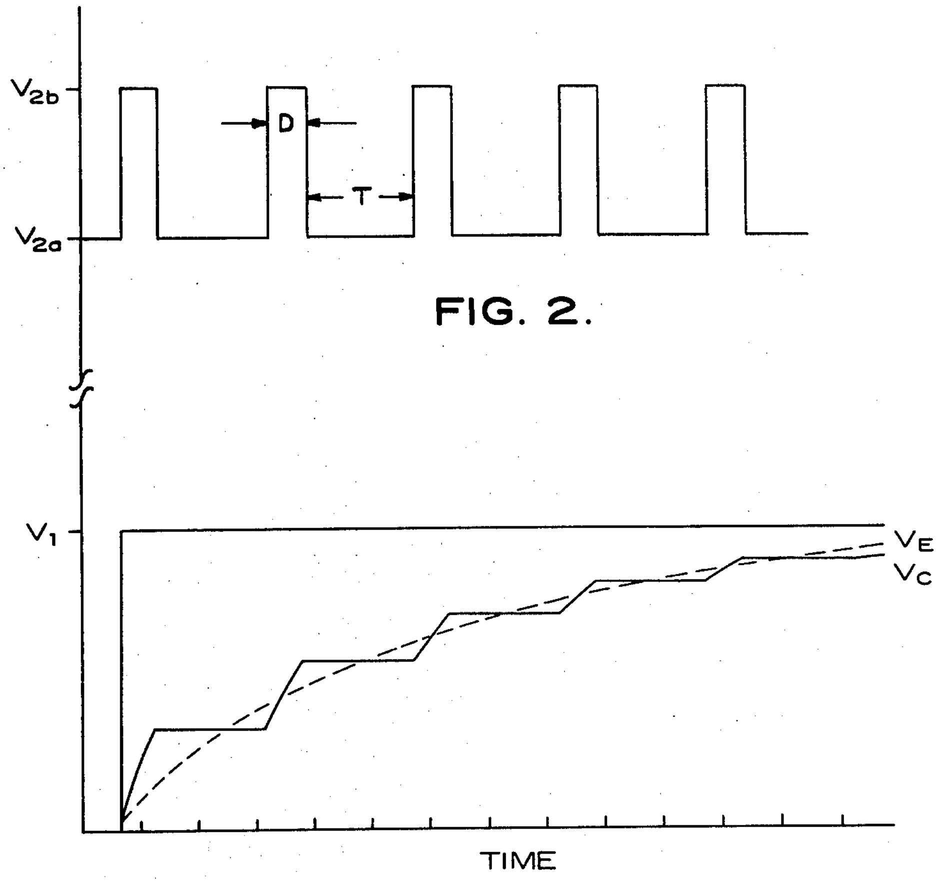
FIG. 2 is a diagram of a typical control signal coupled to the gate of the MOS-FET of the present invention.
FIG. 3 is a diagram of the voltage on the capacitor of the present invention for a step function input signal and the control signal of FIG. 2.

A typical control signal is shown in FIG. 2. The control signal waveform consists of positive, repetitive pulses alternating between signal values $V_{2a}$ and $V_{2b}$. During time D, the time the signal is at value $V_{2b}$, the control signal value is sufficient to place MOS-FET 10 in saturation, wherein it will appear short circuited. During time T, the time the control signal is at value $V_{2a}$, MOS-FET 10 will be cutoff and appear as an open circuit. The average resistance of the series combination of resistor 12 and MOS-FET switch 10 is as follows:

$$R_{av} = R(D+T)/D$$

wherein: $R$ is the resistance of resistor 12.

The charge $V_C$ on capacitor 14 with respect to time, assuming a step function input signal $V_1$, is shown in FIG. 3. Note that capacitor 14 charges only during the periods in which MOS-FET 10 is saturated. $V_E$ is shown to indicate that the present invention can simulate a filter network having a time constant much greater than the time constant of the combination of resistor 12 and capacitor 14.

The half-power bandwidth of an RC low-pass filter is $F = 1/2\pi RC$. For the present invention $R$ equals $R_{av}$. Substituting $R_{av}$ for R, the half-power bandwidth of the present invention is:

$$F = D/2\pi RC(D+T)$$

wherein: $R$ is the resistance of resistor 12, and $C$ is the capacitance of capacitor 14. Thus the bandwidth $F$ of the present invention can be controlled by controlling the quantity $D/D+T$.

Therefore, by controlling the control signal waveform the band-width of a single filter or a bank of filters can be remotely controlled. A variable width pulse generator such as a monostable may be utilized to provide the control signal.

The following example of an operational embodiment will be used to emphasize some of the criteria of the present invention:

| Member | Component | Type or Value |
|---|---|---|
| 10 | NPN MOS FET having insulated gate | MFE 3002 |
| $V_1$(18) | Input signal | −5 volts to +5 volts |
| $V_2$(20*a*) | Control signal | −6 volts to +15 volts |
| $V_3$(20*b*) | Bias | −6 volts d.c. |
| 12 | Resistor | 10,000 ohms |
| 14 | Capacitor | .2 microfarads |
| 16 | Operational amplifier | Type 741 |

It should be noted that $V_3$, coupled to bias input 20*b*, is a constant, negative voltage; $V_2$, coupled to gate input 20*a*, varies between the negative voltage of $V_3$ and a more positive voltage; and $V_1$, coupled to input signal input 18, may vary between a voltage more positive than $V_3$ and the positive voltage limit of the filter. For an NPN MOS-FET the criteria immediately above insure proper operation.

The operation of the present invention is as follows: An input signal is coupled through input 18 to insulated gate MOS-FET 10. MOS-FET 10 acts as a switching transistor controlled by a control signal coupled to gate input 20a.

During periods of saturation of MOS-FET 10 the input signal is transmitted through it to resistor 12. This causes a current to flow through resistor 12 which alters the charge in capacitor 14. The voltage on capacitor 14 provides the input to voltage follower amplifier 16 which provides the filter system output 22. When MOS-FET 10 is cutoff, the input signal is prevented from reaching capacitor 14, and the charge on capacitor 14 remains unchanged.

A contemplated application of the present invention is in radar signal processors, wherein, each input 18 of a plurality of filters arranged in a filter bank would be coupled to one of a plurality of radar signal bins, each bin being coupled to a single filter. The control input 20a of each filter would be connected in parallel with the other filters to a single control signal source for simultaneously controlling the bandwidth of all the filters.

If desired, MOS-FET 10 may be operated as a proportional device instead of a switch. In such a case a controllable DC voltage instead of a pulsed control signal, would be applied to the gate input 20a. The conductance of MOS-FET 10 would then be a function of the d.c. level on 20a. This mode of operation is inferior to that already described in which MOS-FET 10 is used as a saturated switch. This is due to the fact that the conductance of the MOS-FET as a proportional device cannot be controlled with nearly as good accuracy as can be achieved by using the MOS-FET as a saturated switch and controlling the "ON" time.

What is claimed is:

1. A low pass filter comprising:

resistive means for providing electrical resistance, including a resistor and a transistor switch wherein said resistor is directly connected to said transistor switch and said transistor switch is an insulated gate, metallic oxide semiconductor, field effect transistor having a source terminal, a drain terminal, a bias terminal, and an insulated gate terminal, wherein said bias terminal is coupled to a constant direct current voltage, and said insulated gate terminal is coupled to a control signal which controls the mode of said switch;

capacitive means for accepting and retaining an electrical charge, and providing an electrical output;

wherein said capacitive means is a capacitor coupled to the end of said resistor opposite the end coupled to said transistor, and the combination is coupled to an electrical signal providing means such that the electrical charge on the capacitive means is a function of the electrical signal; and wherein said source terminal is coupled to said signal providing means and said drain terminal is coupled to said resistor.

2. The filter of claim 1 wherein said filter further comprises an amplifier coupled to the junction of said capacitor and said resistor for amplifying the voltage on said capacitor and providing the filter output.

3. The filter of claim 2 wherein the half-power bandwidth of said filter is:

$$F=D/2\pi RC(D+T)$$

wherein $R$ is the resistance of said resistor, $C$ is the capacitance of said capacitor, $D$ is the period of time said transistor is in its conductive mode, and $T$ is the period of time said transistor is in its resistive mode.

4. The filter of claim 3 wherein:

said transistor is an NPN field effect transistor; and the voltage of said control signal is approximately equal to said constant direct current voltage during said period of time $T$, and more positive than said constant direct current voltage during said period of time D.

* * * * *